(12) United States Patent
Otsuka et al.

(10) Patent No.: US 6,625,005 B2
(45) Date of Patent: Sep. 23, 2003

(54) SEMICONDUCTOR CIRCUIT DEVICE HAVING POWER AND GROUND LINES ADAPTED FOR HIGH-FREQUENCY OPERATION

(75) Inventors: Kanji Otsuka, Higashiyamato (JP); Tamotsu Usami, Kokubunji (JP)

(73) Assignees: Kabushiki Kaisha Toshiba, Kawasaki (JP); Fujitsu Limited, Kawasaki (JP); Hitachi Ltd., Tokyo (JP); Matsushita Electric Industrial Co., Ltd., Osaka (JP); Mitsubishi Electric Corp., Tokyo (JP); NEC Corporation, Tokyo (JP); Oki Electric Industry Co., Ltd., Tokyo (JP); Kanji Otsuka, Tokyo (JP); Rohm Co., Ltd., Kyoto (JP); Sanyo Electric Co., Ltd., Osaka (JP); Sharp Kabushiki Kaisha, Osaka (JP); Sony Corporation, Tokyo (JP); Tamotsu Usami, Tokyo (JP)

( * ) Notice: Subject to any disclaimer, the term of this patent is extended or adjusted under 35 U.S.C. 154(b) by 0 days.

(21) Appl. No.: 09/900,960

(22) Filed: Jul. 10, 2001

(65) Prior Publication Data

US 2002/0008597 A1 Jan. 24, 2002

(30) Foreign Application Priority Data

Jul. 11, 2000 (JP) .......................................... 2000-209861

(51) Int. Cl.$^7$ ................................................. H01G 4/00
(52) U.S. Cl. ..................... 361/301.2; 361/321; 361/386; 361/729; 361/728; 257/680; 257/659
(58) Field of Search .............................. 361/301.2, 320, 361/321, 321.4, 386, 738, 794, 728, 729; 257/778, 680, 659

(56) References Cited

U.S. PATENT DOCUMENTS

| 5,140,407 | A | * | 8/1992 | Kamada |
| 5,402,318 | A | * | 3/1995 | Otsuka et al. |
| 5,426,377 | A | * | 6/1995 | Kimura |
| 5,646,549 | A | * | 7/1997 | Yamamoto |
| 6,097,097 | A | * | 8/2000 | Hirose |

FOREIGN PATENT DOCUMENTS

| DE | 44 02 082 A1 | 8/1994 |
| DE | 69115856 T2 | 8/1996 |
| EP | 0324244 A2 | 7/1989 |
| JP | 63092047 A | 4/1988 |
| JP | 63107204 A | 5/1988 |
| JP | 63122159 A | 5/1988 |
| JP | 01027251 A | 1/1989 |
| JP | 10069342 A | 3/1998 |
| JP | 11-284126 | 10/1999 |
| JP | 2000058595 A | 2/2000 |
| JP | 2000-174505 | 6/2000 |

* cited by examiner

Primary Examiner—Dean A. Reichard
Assistant Examiner—Nguyen Ha
(74) Attorney, Agent, or Firm—Nixon & Vanderhye P.C.

(57) ABSTRACT

In a semiconductor chip are arranged power pads, ground pads and signal pads. A ground line is provided which is formed as one in the vicinity of the chip and branches off at some distance from the chip. Signal lines and power lines are each formed over one of the branched ground lines. The signal lines and the power lines are extended radially together with the underlying ground lines. Each of the signal lines and the power lines are extended together with the corresponding ground line to form a stacked pair line.

23 Claims, 14 Drawing Sheets

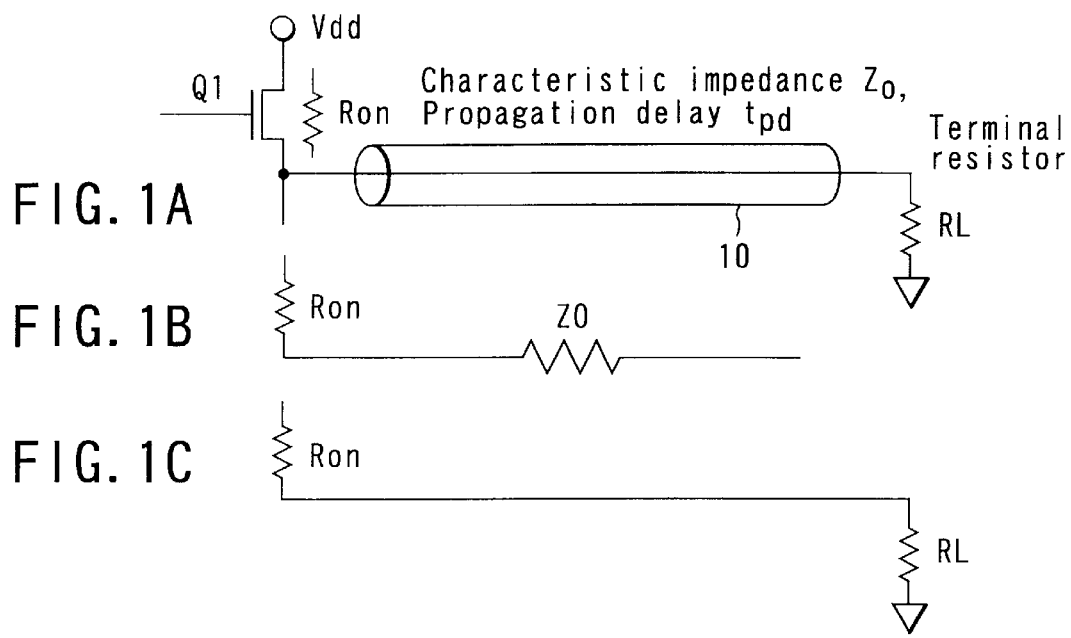
FIG. 1A
FIG. 1B
FIG. 1C
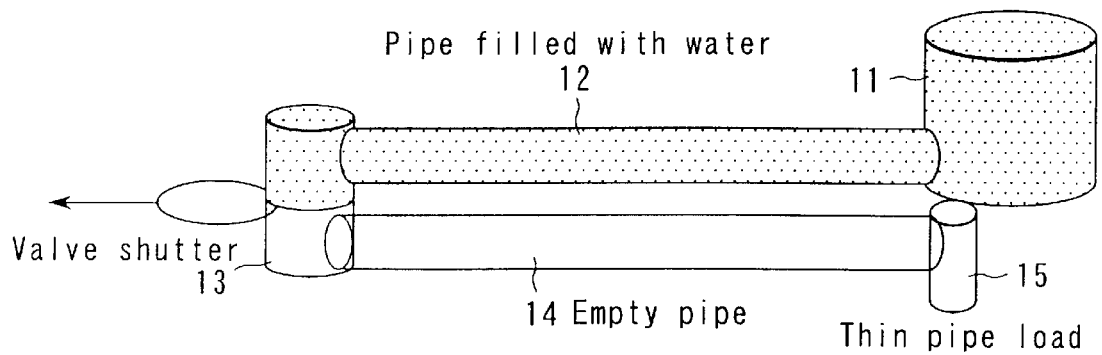
FIG. 2

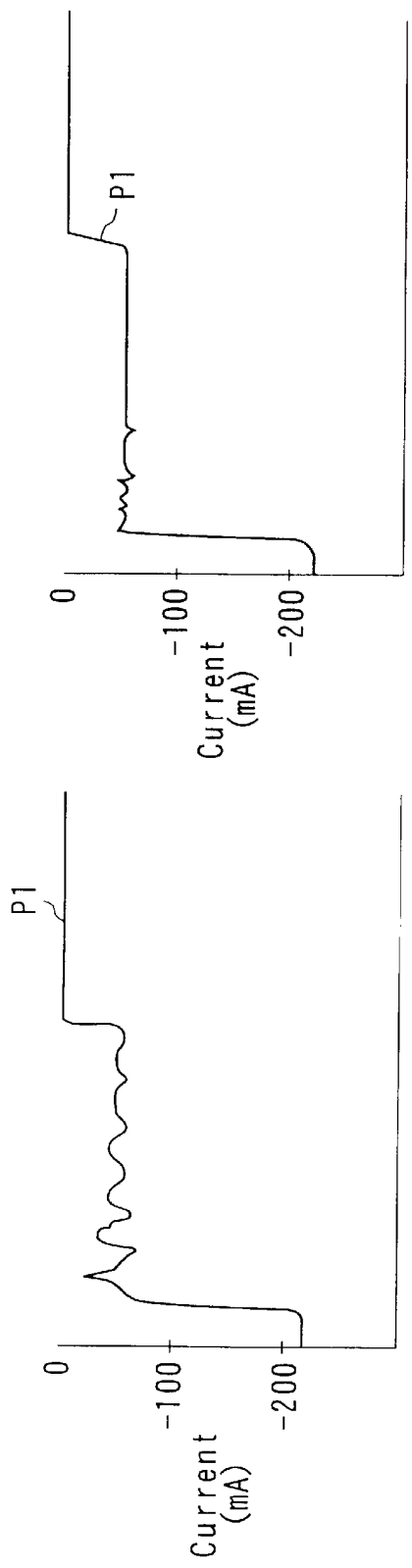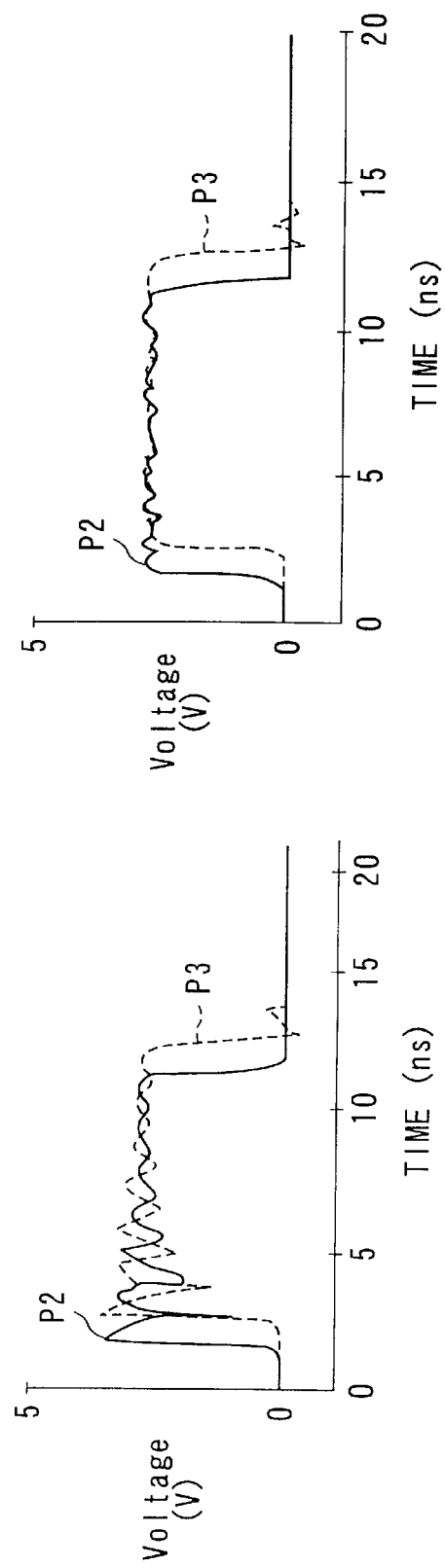
FIG. 8C
FIG. 8D
FIG. 8A
FIG. 8B

SEMICONDUCTOR CIRCUIT DEVICE HAVING POWER AND GROUND LINES ADAPTED FOR HIGH-FREQUENCY OPERATION

CROSS-REFERENCE TO RELATED APPLICATIONS

This application is based upon and claims the benefit of priority from the prior Japanese Patent Application No. 2000-209861, filed Jul. 11, 2000, the entire contents of which are incorporated herein by reference.

BACKGROUND OF THE INVENTION

The present invention relates to the structure of interconnections in digital semiconductor circuits and more specifically to the structure of power and ground lines in semiconductor devices or semiconductor integrated circuit chips adapted for high-frequency operation.

In digital semiconductor circuits, transistors act as on-off switches. Even if transistors are turned on, they cannot output any signal unless they are supplied with electrical energy. The transistors are connected to a power supply from which electrical energy is supplied and ground to which the supplied energy drains. If, when a switch, consisting of a transistor, is turned on quickly, its on resistance is low, then a phenomenon will occur in which, in supplying electrical energy (charges) from the power supply to the transistor, the power line shows a deficiency in charge supply capacity.

Why the power line fails to supply electrical energy will be described later in detail. Here, let us consider a power and ground line pair as a transmission line. If its characteristic impedance is, say, 50 ohms and the on resistance of the transistor is, say, 15 ohms, the power line will fail to supply electrical energy. Fortunately, in many cases, the characteristic impedance of the signal line connected to the transistor is higher than 50 ohms and the problem of shortage of electrical energy can be avoided; otherwise, it is required to lower the characteristic impedance of the power and ground line pair.

Another problem is the behavior of inductance of lines that resist an abrupt increase in current. Even if the characteristic impedance of the power and ground line pair is made lower than that of the signal line, when the transistor is turned on quickly, the parasitic inductance associated with the power and ground lines retards the supply of electrical energy through the power and ground lines. Therefore, it also becomes necessary to reduce the parasitic inductance associated with the power and ground lines.

Still another problem is that a signal may not be output at a sufficient level until the gate capacitance associated with the gate electrode has been fully charged. In other words, a problem arises in that the potential of an output signal does not reach a desired level in a short time. This is the delay associated with the operation of the transistor itself, causing the supply current to continue to flow until the output signal potential reaches a predetermined level. The load impedance at this time is different from the characteristic impedance of the signal transmission line and, simply stated, the current becomes infinite. if the power and ground lines in a pair form a transmission line, reflected noise appears on the transmission line during such an interval.

With conventional semiconductor circuit devices, the situation where the charge supply capacity of the power and ground lines and the transistor characteristics result in failure to switch transistors smoothly becomes noticeable especially in digital circuits that operate in frequency bands of the order of GHz.

BRIEF SUMMARY OF THE INVENTION

It is therefore an object of the present invention to provide a semiconductor circuit device which allows power-ground pair lines to have a sufficient charge supply capacity without being limited by the characteristics of transistor gate circuits.

According to the present invention, there is provided a semiconductor circuit device comprising: a transmission line composed of a power line and a ground line which have substantially the same thickness and are formed one above the other, the power line and the ground line are electrically separated each other; and an electronic circuit coupled with the transmission line to receive a supply voltage through the transmission line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 1A, 1B and 1C show circuit models for use in explaining the principles of the invention;

FIG. 2 shows a model of a pipeline using a tank, a valve and pipes for use in explaining the changes in the charge density in the circuit model of FIG. 1A;

FIGS. 8A to 8D are waveform diagrams illustrating the results of simulation using the circuit of FIG. 7;

DETAILED DESCRIPTION OF THE INVENTION

Figure 3A:
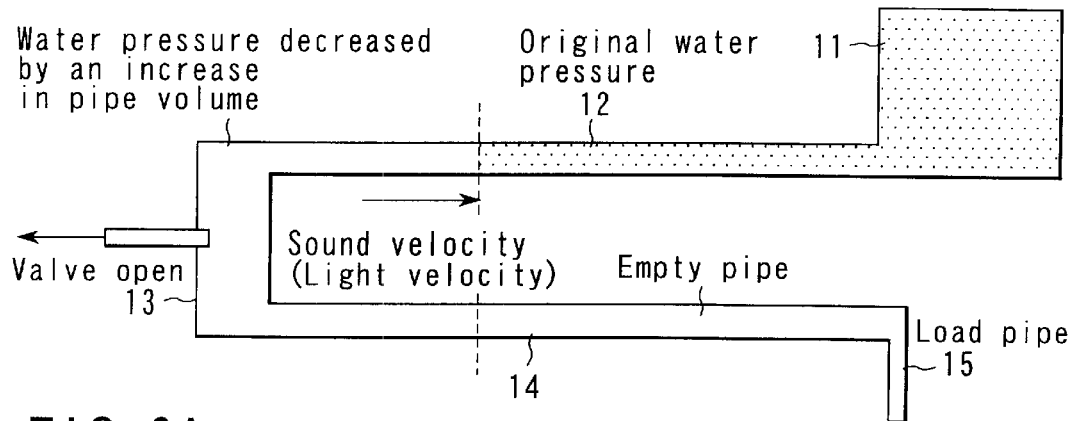
FIGS. 3A and 3B are conceptual diagrams of the model of FIG. 2.

Before describing the embodiments of the present invention, the principles of the present invention will be described first.

FIG. 1A shows a circuit model in which the current path of a transistor gate circuit has its one end connected to a power supply and its other end connected to a terminal resistor RL through a signal transmission line 10. The transistor gate circuit consists of a single MOS transistor Q1. When the transistor Q1 is turned on with an ideal input signal, an on current Io flows in it, which is given by Io=Vdd/Ron where Vdd is the supply voltage and Ron is the on resistance of the transistor Q1. When the power supply can supply charges corresponding to that current in a moment, such an on current as represented by the above expression flows.

With no delay involved in turning on the transistor Q1, the moment the transistor is turned on, the current confronts the signal transmission line 10 with a resistance corresponding to its characteristic impedance Zo. The equivalent circuit at this point is illustrated in FIG. 1B. At this point, the current IT=Vdd/(Ron+Zo) flows in the signal transmission line 10. Usually, Io is ignored. It is important whether the power supply can supply charges flowing in IT. The current is defined as the amount of electric charge transferred. The amount of charge is given by Q=I×t (t is time). Although it is difficult to define the spatial charge density, the spatial charge density at each point is defined as the voltage at that point. That Vdd is not ensured at each point can be understood. Assuming that the power supply is an ideal one and this continues throughout the propagation delay time tpd of the signal transmission line 10, the total amount of charge, QT, injected into the signal transmission line 10 is given by QT=IT×tpd.

Subsequent to encountering the resistance of the signal transmission line, the current IT will feel a new load RL. The transmission line 10, which has already been charged fully, no longer acts as the load, in which case the equivalent circuit becomes as shown in FIG. 1C. That is, at this point the current IL=Vdd/(Ron+RL) flows in the transmission line 10. Since the moment the current IT flowed in the transmission line 10 arrives at the load RL, it becomes IL, if IT>IL, then the charge is reflected, as it is, back into the transmission line 10.

Conversely, if IT<IL, then negative reflection occurs. After 2 tpd, the power supply is affected by the negative reflection. However, since the present invention aims at solving various problems in the initial condition, the problem of negative reflection is not discussed herein. However, solving the first problem results in solving problems of secondary importance, increasing the design margin for circuit forms.

These state changes occur at the velocity of light. The switching speed of transistors is too late relative to the velocity of light over the length of the transmission line. Heretofore, it was therefore necessary to have an understanding of the problem of time displacement as discussed in conjunction with FIGS. 1A–1C.

Next, the changed states of charge density in the circuit model shown in FIG. 1A will be described in terms of a pipeline model using a tank, a valve, and pipes.

Suppose that a large tank 11 filled with water (charge) is coupled through a pipe 12 with a valve 13 and the lower portion of the valve 13 is coupled through an empty pipe 14 with a thin load pipe 15. This configuration is considered to be the circuit shown in FIG. 1A; the tank 11 corresponds to the power supply, the pipe 12 to the power line, the valve 13 to the transistor gate, the pipe 14 to the signal line, and the load pipe 15 to the load.

In the figure, dotted portions indicate that there is water (charge). It is supposed here that the valve 13 (transistor) is filled with water up to its top.

Figure 3B:
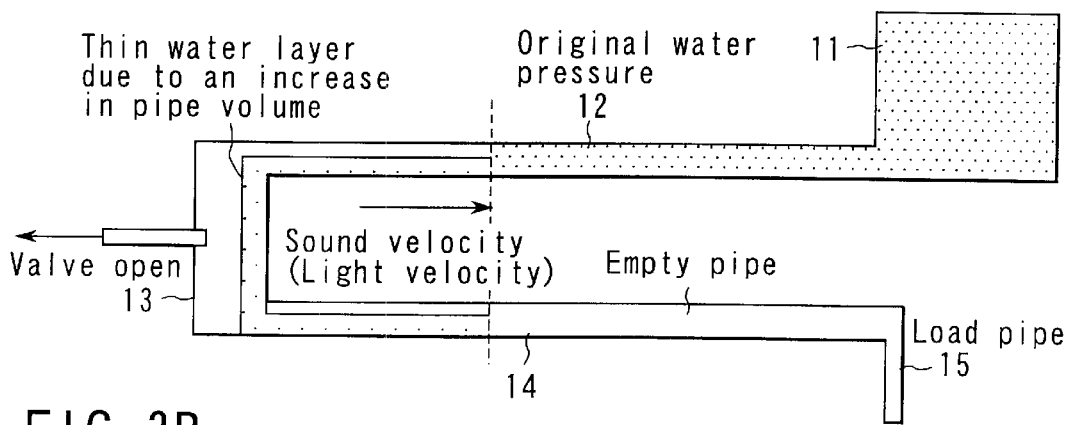

Assuming now that the power line and the signal line are of the same thickness, i.e., they have the same characteristic impedance, such a conception as shown in FIGS. 3A and 3B results.

The moment the valve 13 is opened, the water (charge) in the pipe 12 filled up to the top of the valve falls below. Even with gravity ignored, the water flows into the space of water pressure 0. For this reason, the water pressure (voltage) in the pipe 12 above the valve 13 is lowered inevitably. The effect of the lowered water pressure (the effect of the opening of the valve) travels to the tank 11 at the velocity with which pressure propagates; however, it takes some time for the effect to arrive at the tank because the pipe 12 is long. The velocity at which pressure propagates is equal to the velocity of sound (the velocity of light for electrical signals). In this connection, for water, the velocity is about 1000 m/s. To compensate for the increased volume of the pipe resulting from water flow in the valve portion, the water in that portion must cause cubical expansion. That is, the increased volume of the pipe results in lowering the water pressure. The pipes 12 and 14 above and below the valve 13 are of the same thickness, which allows the pipe volume to be increased by a factor of two. As with solids, water expands little. Therefore, only half of the cross section of the pipe becomes filled with water as shown in FIG. 3B.

The electronic circuit of FIG. 1A can also be considered exactly the same. Since any of the electron densities can be changed, the electronic circuit can be conceptualized as illustrated in FIG. 3A. Naturally, electrons travel at the velocity of light. When the electron density is reduced by half, the voltage is also lowered to half of the supply voltage, i.e., (½) Vdd. The on current IT is expected to be IT=Vdd/(Ron+Zo); however, the on current is only (½) IT=(½) Vdd/(Ron+Zo) during the interval t=0 to t=2 tpd.

Here, the power line is assumed to have the same thickness and the same characteristic impedance as the signal line. Let the propagation delay time tpd associated with the signal line be 1 ns. Then, a 1-GHz clock signal (the duty factor is 50% and the on period is 0.5 ns) will be delayed on the signal line by one cycle period.

As can be seen from the description thus far, increasing the thickness of the pipe corresponding to the power line, i.e., lowering the characteristic impedance of the power line, allows the on current to be prevented from being reduced. This is the principle of the present invention.

Figure 4:
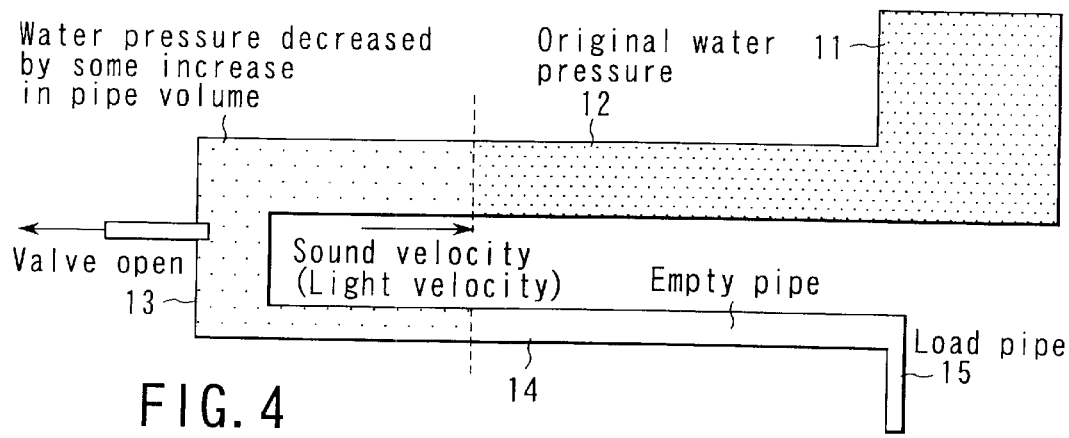
FIG. 4 is a conceptual diagram of a semiconductor circuit device of the invention based on a model of a pipeline using a tank, pipes and a valve.
Figure 5:
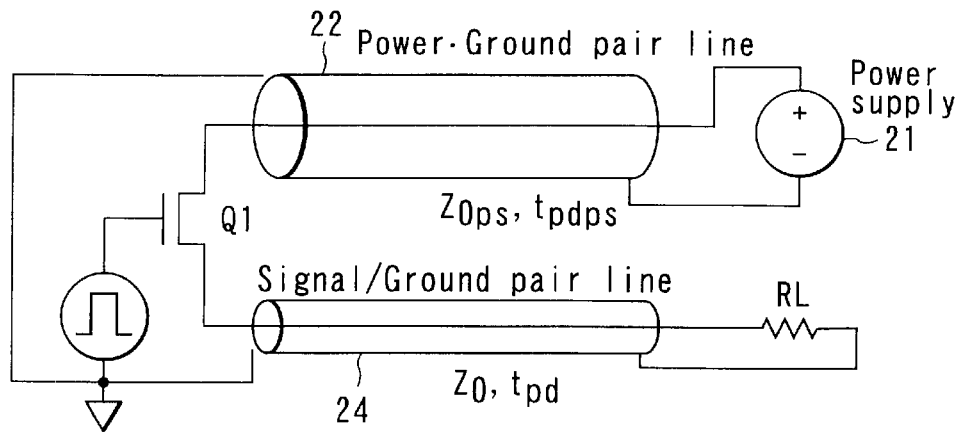
FIG. 5 shows an electronic circuit corresponding to the pipeline of FIG. 4.

In FIG. 4, the semiconductor circuit device of the present invention is expressed conceptually in terms of a model using a tank, pipes and a valve as in FIG. 3A. In FIG. 4, unlike FIG. 3A, the pipe 12 on the side of the tank 11 is made thicker than the pipe 14 on the load side. An electronic circuit corresponding to such a pipeline becomes as depicted in FIG. 5, in which case a power supply 21, a power line 22, a switching MOS transistor Q1, a signal line 24 and a load RL correspond to the tank 11, the pipe 12, the valve 13, the pipe 14 and the load pipe 15, respectively, in FIG. 4. In the circuit of FIG. 5, the power line 22 consists of a pair of power and ground conductors and the signal line 24 consists of a pair of signal and ground conductors. It is assumed that, for the power-ground pair line, the characteristic impedance is Z0 ps and the propagation delay is tpdps and, for the signal-ground pair line, the characteristic impedance is Z0 and the propagation delay is tpd.

In the model of FIG. 4, a change in the pipe volume caused by the pipe 14 is small. Correspondingly, in the electronic circuit of FIG. 5, a voltage drop in the power line 22 is made small. Assuming the characteristic impedance of the power line 22 to be 10 ohms and that of the signal line 24 to be 50 ohms, a voltage drop when the on resistance of the transistor Q1 is 10 ohms is {(50+10)/(10+10+50)}Vdd≈0.857 Vdd.

This will be described next. Since current flows in the power-ground pair line 22 connected to the power supply 21 and having the characteristic impedance Z0 ps, a voltage drop of Vdd×(Ron+Z0)/(Ron+Z0+Z0 ps) occurs in the signal-ground pair line 24 during the propagation delay time tpdps resulting from the length of the line 22. Here, times are defined more accurately. Assuming the voltage drop occurs at time t, when tpd≧tpdps, 0<t<tpdps. When tpd≦tpds, 0<t<tpd. When tpd<t<tpdps, a voltage drop of Vdd×(Ron+RL)/(Ron+RL+Z0 ps) is produced.

The voltage at the power-ground pair line 22 may falls. In this case, the power supply 21 needs some time to compensate for the voltage drop, and the voltage at the pair line 22 will change thereafter. How the voltage change is not described here, because the present invention is concerned with the initial operating state of the power-ground pair line 22.

Assuming now that the characteristic impedance of the power-ground pair line 22 is substantially equal to that of the signal-ground pair line 24 and the on resistance of the transistor Q1 is negligibly small in comparison with the characteristic impedance, a magnitude of (½) Vdd is applied to the load RL. If the load RL is a CMOS gate and its input capacitance is of the order of tens of femtofarads (fF), the transmission line can be considered to be substantially open-circuited, so that total reflection of signal energy occurs. Thus, the voltage to which the CMOS gate is subjected becomes (½)×2 Vdd=Vdd. Under this condition, the signal is propagated normally to the gate only with the propagation delay associated with the signal line. Therefore, the worst condition under which a signal is propagated normally to the load is that the characteristic impedance of the power-ground pair line 22 is substantially equal to and preferably less than that of the signal-ground pair line 24.

When charges are propagated to a number of signal lines through a single power-ground pair line, its characteristic impedance is set to be equal to or less than the characteristic impedance of each signal line divided by the number of signal lines, i.e., Z0 ps≦Z0/N where Z0 ps is the characteristic impedance of the power-ground pair line, Z0 is the characteristic impedance of the signal lines, and N is the number of signal lines. An exemplary circuit in which N=2 is illustrated in FIG. 6.

Figure 6:
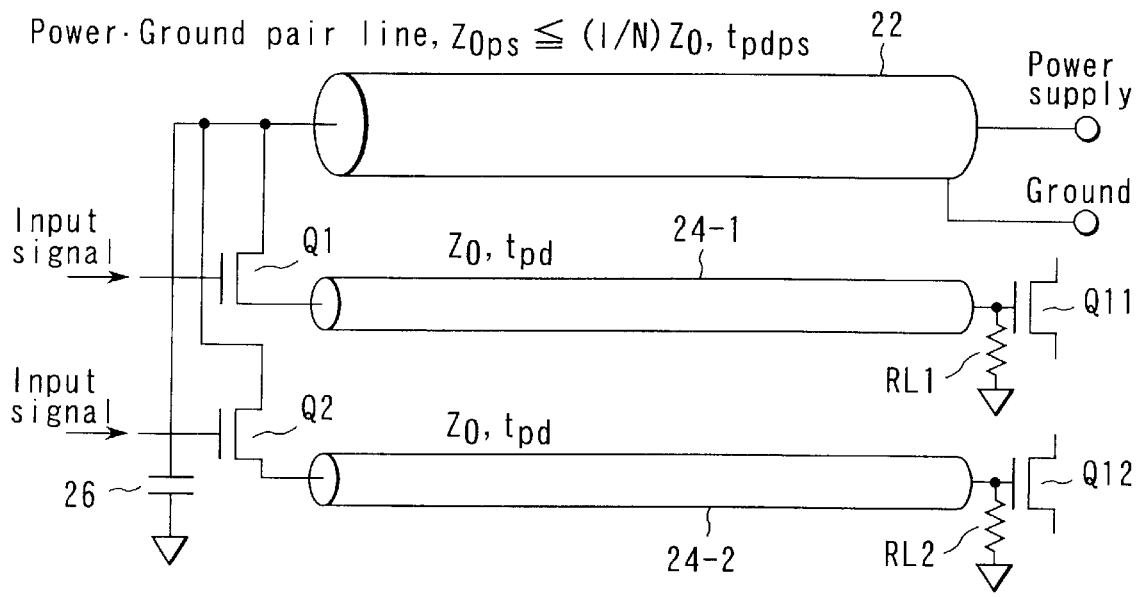
FIG. 6 shows a circuit diagram in the case where two signal lines are used in the circuit of FIG. 5.

In the circuit of FIG. 6, to the power-ground pair line 22 are connected the current paths of two MOS transistors Q1 and Q2, which act as drivers and are turned on and off by input signals. The other ends of the current paths of the transistors Q1 and Q2 are connected to signal-ground pair lines 24-1 and 24-2, which are terminated by resistors RL1 and RL2, respectively. MOS transistors Q11 and Q12 are receiving transistors.

Assuming the characteristic impedance of each of the signal-ground pair lines 24-1 and 24-2 to be Z0, the worst condition under which the signal voltage is propagated normally to the load is Z0 ps≦(1/N)Z0.

Unless the power-ground pair line 22 is a transmission line that is continuously uniform in the vicinity of the transistor gate or gates, i.e., the transistor Q1 in FIG. 5 or the transistors Q1 and Q2 in FIG. 6, the supply of charges cannot be performed quickly and the effects as described previously cannot be obtained satisfiably.

Suppose that the power-ground pair line 22 is discontinuous. This corresponds to the situation where, in FIG. 2, that portion of the pipe 12 which is coupled with the valve 13 is thinned. A structure that avoids such a situation as much as possible should be taken, which will be described below.

As described previously, the time of the voltage drop given by Vdd×(Ron+Z0)/(Ron+Z0+Zops) is defined to be 0<t<tpdps. In general, the power supply is located at a distance from the transistor gate. When tpd≦tpdps, the duration of the voltage drop becomes long. In order to allow the power-ground pair line 22 to be terminated not only by a CMOS arrangement but also by a large-capacitance gate circuit that may be configured variously, a bypass capacitor 26 is simply connected, as shown in FIG. 6, between ground and those ends of the transistors Q1 and Q2 which are connected together to the power-ground pair line.

When connected in this manner, the capacitor 26 is placed in the charged state at all times. At the time of closing the gate circuit, the capacitor acts as a power supply that provides electric charge. The capacitance of the bypass capacitor 26 is determined in the following manner.

In FIG. 6, when the transistors Q1 and Q2 are turned on, an on current of IT=Vdd/(Ron+Z0) flows in each of the signal-ground pair lines 24-1 and 24-2. Since two circuits are connected to the power-ground pair line 22 in the example of FIG. 6, the total on current is twice as much as IT. During the period of tpd, the current flows and the voltage rises, causing the receivers, i.e., the transistors Q11 and Q12, to be turned on. The amount of electric charge at this point is represented by $QT=2\times IT\times tpd=2\times tpd\times Vdd/(Ron+Z0)$ For example, let Ron=10 Ω, Vdd=0.5 V, Z0=28 Ω and tpd=1 ns. Then QT=26 pC. That is, the capacitance of the bypass capacitor is 52 pF under the conditions that the supply voltage is 0.5 V. To allow for sufficient margin, the capacitor 26 is allowed to have capacitances several times to several tens of times (up to 100 times) larger than that value. For example, with 5 to 20 times, the capacitance lies in the range of 260 to 1040 pF. The bypass capacitor 26 having its capacitance thus set is located as close to the transistor gate circuit as possible.

Here, the connection points of the bypass capacitor 26 and the results of simulation of voltage and current at circuit points will be described.

Figure 7:
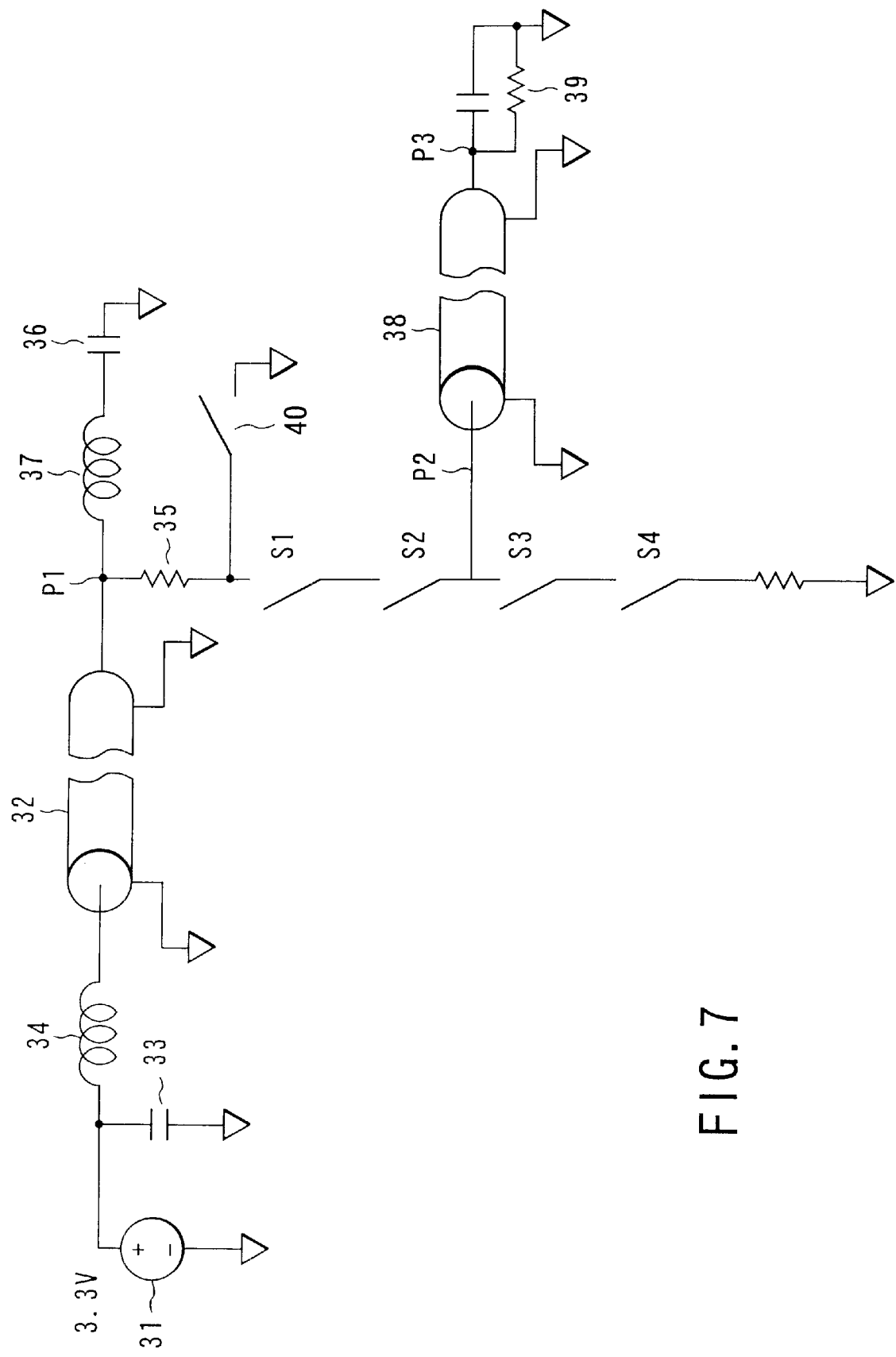
FIG. 7 shows a circuit arrangement used to simulate voltage and current at the bypass-capacitor connected point and other points in the circuit of FIG. 6.

FIG. 7 shows a circuit arrangement used for simulation. A power supply is a 3.3 V supply. The counterpart of the above power-ground line pair 22 is a power-ground pair line 32, which has some capacitance and some inductance. The capacitance component is indicated at 33 and the inductance component is indicated at 34. The propagation delay time in the power-ground line pair 32 is assumed to be 0.5 ns. This arrangement causes line reflections and, to prevent reflections, the line 32 is terminated by a resistor 35 of, say, 15 ohms.

The counterpart of the bypass capacitor 26 is a capacitor 36. An inductance, whose value varies according to the connection point of the capacitor 36, is indicated at 37. In this case, since only one power-ground line pair is provided, the capacitance of the capacitor 36 is set to 0.01 µF. The value of the inductance 37 is set to 5 nH when the bypass capacitor 26 is located at a distance of 5 mm from the transistor gate circuit powered from the power-ground pair line 32 and to 0.05 nH for a distance of 0.5 mm.

The transistor gate circuit supposes a CMOS driver circuit consisting of two types of switches: one adapted to supply the supply voltage to the signal-ground pair line and one adapted to connect the pair line to ground. The CMOS driver circuit is constructed from four switches S1 to S4. The common node of the switches S2 and S3 is connected to the signal line in the signal-ground pair line 38. The signal-ground pair line 38 is terminated by a receiver 39 indicated by an equivalent resistor of, say, 50 ohms.

A switch 40 connected between the termination resistor 35 of the power-ground pair line 35 is used for initialization at the time of simulation and is not needed in a practical circuit.

Measurements of variations in the supply current, variations in the output voltage of the transistor gate circuit and variations in the input voltage to the receiver when a pulse-like input signal is applied to the transistor gate circuit showed the results as shown in FIGS. 8A to 8D. FIGS. 8A and 8B show variations in supply current at point P1 in FIG. 7 and variations in voltage at points P2 and P3, respectively, when the bypass capacitor 26 is located relatively far from the transistor gate circuit and hence the inductance 37 is set to 5 nH. Also, FIGS. 8C and 8D show variations in supply current at point P1 in FIG. 7 and variations in voltage at points P2 and P3, respectively, when the bypass capacitor 26 is located close to the transistor gate circuit and hence the inductance 37 is 0.5 nH.

As is evident from FIGS. 8A and 8C, when the inductance value is 5 nH, the supply current after the switches S1 and S2 have been turned on fluctuates more greatly than with 0.5 nH. A high current of −220 mA before the switches are turned on results from switching of the initialization switch 40 at the time of simulation and is independent of inherent characteristics. Evidently, a problem arises when the connection point of the bypass capacitor 26 is as far as 5 mm away from the transistor gate circuit.

On the other hand, both the output voltage of the transistor gate circuit and the input voltage to the receiver fluctuate more greatly in the case of 5 nH and will not converge. In this case, the voltage at point P2 in FIG. 7 rises in as little as 1 ns and its equivalent frequency corresponds to 300 MHz. In the case of a rise time of 100 ps which is one order of magnitude smaller than 1 ns, the equivalent frequency is 3 GHz. The inductance value is 0.5 nH for the case of FIGS. 8A and 8B and 0.05 nH for the case of FIGS. 8C and 8D. These inductance values correspond to distances of 0.5 and 0.05 mm. This means that, as the operating frequency of the transistor gate circuit increases, it becomes necessary to locate the bypass capacitor closer to the transistor gate circuit. It is desirable to make the leakage inductance XpH in the bypass capacitor 26 and its associated wiring smaller than 1/A (GHz)×100 ps (A is the equivalent frequency). This expression, while being mismatched in unit, was obtained empirically from digital circuits that operate in frequency bands of the order of GHz.

Figure 9:
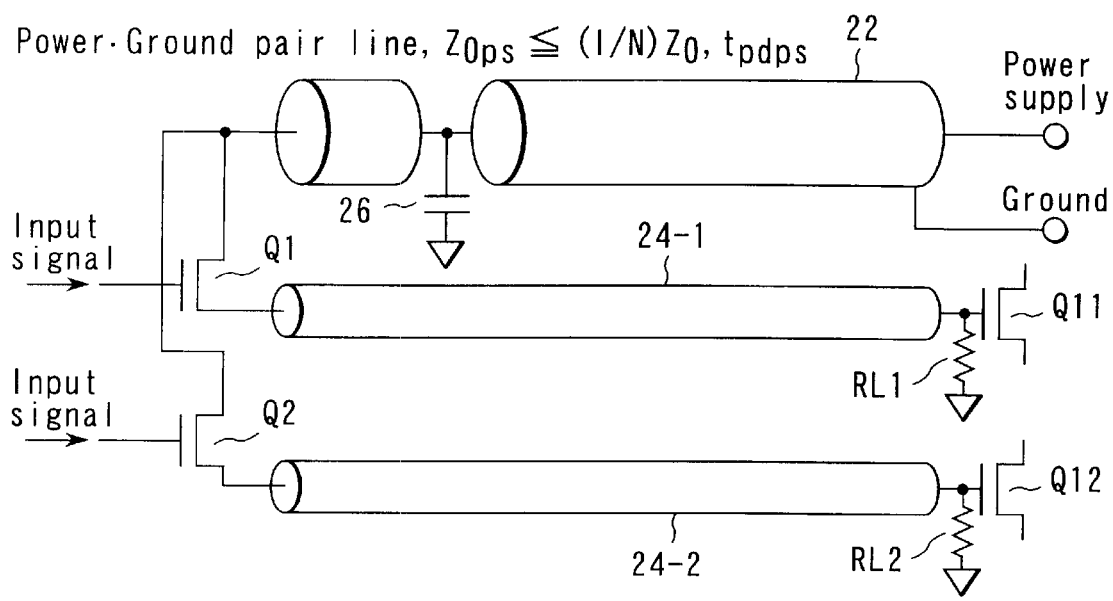
FIG. 9 is a circuit diagram in which the bypass-capacitor connected point of FIG. 6 is changed.

However, transistors and capacitors have physical sizes and suffer from limitations on their downsizing. As shown in FIG. 9, therefore, the bypass capacitor 26 has often to be located midway between both ends of the power-ground pair line 22. In this case, the bypass capacitor will be charged for tpd+tpdpsl (tpdpsl is the propagation delay time in one of two sections of the line 22), requiring a corresponding increase in its capacitance. In the above example, when tpdpsl=0.1 ns, the capacitance of the bypass capacitor 26 is in the range of 156 to 572 pF.

Even with various conditions in mind, capacitances of 500 pF to 5 nF are adequate for the bypass capacitor 26; thus, a low-inductance structure can be taken. The specific structure of the bypass capacitor 26 will be described later.

The power-ground pair line 22 has a fixed characteristic impedance at any point on the line. Suppose here that the transistor connected to the power-ground pair line 22 is turned on and current begins to flow through its on resistance. If the capacitive component of the transistor were zero, then charges would flow instantly from the pair line 22 to the signal transmission line and be limited by its characteristic impedance. As discussed in conjunction with FIG. 1B, charges, i.e., a current, flow at IT=Vdd/(Ron+Z0).

If, however, the transistor has a gate capacitance CG, the current encounters that capacitance before it senses the on resistance. At that moment, the resistance becomes zero, so that a spike current flows and the voltage becomes zero. Then, the current meets the on resistance with the result that the voltage begins to rise. The voltage rising characteristic is represented by v=Vdd exp(−t/RonCG). The current then reaches the steady state in which IT=Vdd/(Ron+Z0). Viewed from the power-ground pair line 22, the situation is such that a transmission line having a delay time corresponding to a time constant determined by the on resistance and the gate capacitance is placed short of the signal transmission line. As a result, negative reflections occur, producing noise in the power-ground pair line.

Figure 10:
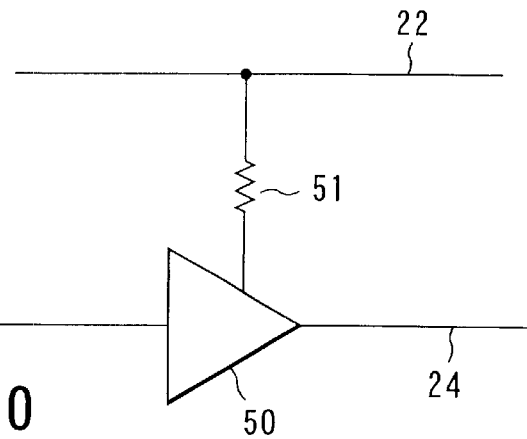
FIG. 10 shows an exemplary circuit in which a resistor is inserted into a power supply section consisting of paired power and ground lines in a transistor gate circuit.

To prevent this, a resistor 51 is simply connected between the transistor gate circuit 50 and the powerground pair line 22 as shown in FIG. 10. The value Rps of the resistor 51 is set to satisfy Z0=Ron+Rps.

As a consequence, the time-constant-based delay time tt associated with the transistor is given by tt=(Ron+Rps) CG. In comparison with the absence of Rps, an additional delay of Δt=Rps CG occurs. This is not a serious problem in the signal bus circuit. Considering the future trend in transistor structures, such as SOI (Silicon On Insulator), which allow the gate capacitance CG to be reduced, it is expected that the additional delay offers no serious problem.

Next, a first embodiment of the present invention will be described in terms of a semiconductor circuit device including an LSI (Large Scale Integrated circuit) chip and its associated package.

Figure 11:
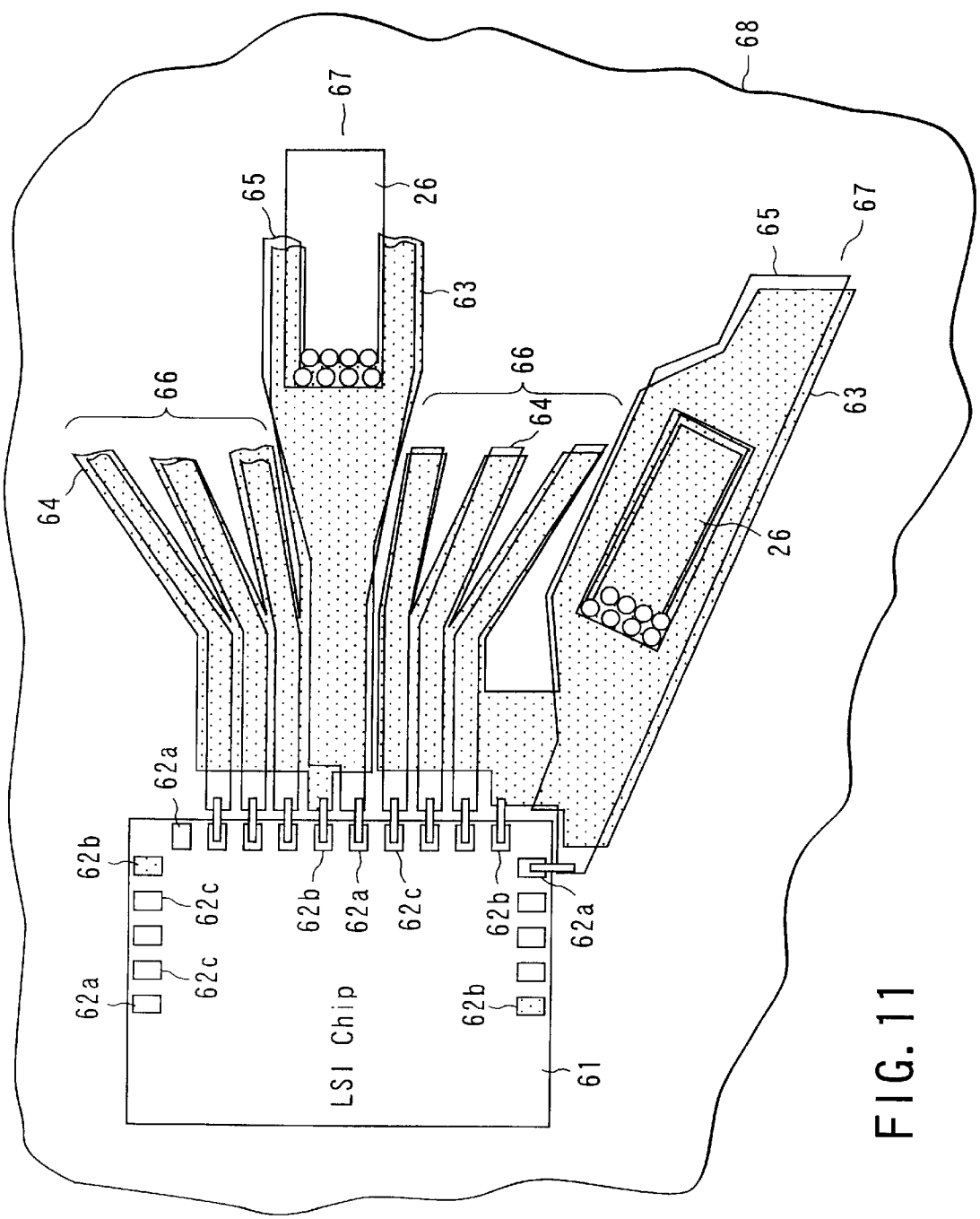
FIG. 11 is a plan view of a semiconductor circuit device including an LSI chip and its associated package in accordance with a first embodiment of the invention.

As shown in FIG. 11, three types of pads 62a, 62b and 62c are arranged on the periphery of an LSI chip 61. The pads 62a are power supply pads, the pads 62b are ground pads, and the pads 62c are signal pads. Around the chip 61 are provided ground lines 63 each of which consists of a conductive layer that is formed wide in the vicinity of the chip and branches off in the place at some distance from the chip. The ground lines are each shown dotted. Over the ground lines 63 are formed signal lines 64 and power lines 65 with interlayer insulating films interposed therebetween. The signal lines 64 and the power lines 65 extend radially together with the underlying ground lines. The signal lines 64 and the power lines 65 are each extended from the place where the ground lines branch off together with the underlying ground line as a stacked pair line.

In the example of FIG. 11, three signal-ground pair lines 66 and one power-ground pair line 67 form one set, and a plurality of sets are placed along with the chip 61 on a package 68 as a wiring board.

By making the width of the power-ground pair line 67 in each set three times or more larger than the width of the signal-ground pair line 66 the previously described condition that Z0 ps≦(1/N)Z0 can be satisfied. When the thickness of the interlayer insulating film in the power-ground pair line 67 is smaller than that in the signal-ground pair line 68, the width of the power-ground pair line may be less than or equal to that of the signal-ground pair line. In short, such transmission lines as satisfy the condition that Z0 ps≦(1/N)Z0 are formed up to the vicinity of the chip.

As can be readily guessed from FIG. 11, a flip chip or TAB bonding chip can be adapted to the LSI chip 61. The fundamental conditions are to place transmission lines that satisfy the condition of Z0 ps≦(1/N)Z0 so that their ends are as close to bumps as possible. The bumps are provided in place of pads on a chip.

The plan configuration of the power-ground pair line 67 is such that it branches off into two in the place where the previously described bypass capacitor 26 is attached and then forms into one again. The width of each of the two branches is set to substantially half the width of the non-branched portion. This allows the power-ground pair line 67 to maintain the continuity of its characteristic impedance.

The bypass capacitor 26 has flip-chip type electrodes as shown. The electrode pads and the ground pads are extended from substantially the same place for connection to the power-ground pair line 67. The pads are formed on the side of transistor gates within the LSI chip. This allows the pad pullout vector to be the same vector as the power-ground pair line 67 which goes toward the transistor gates.

Signals input from the signal pads 62c of the LSI chip 61 are generally applied to receivers. Signals are output from drivers each paired with a respective one of the receivers through the signal pads to the outside of the chip. The receiver and the driver in each pair are connected together to one of the power-ground pair lines.

Figure 12:
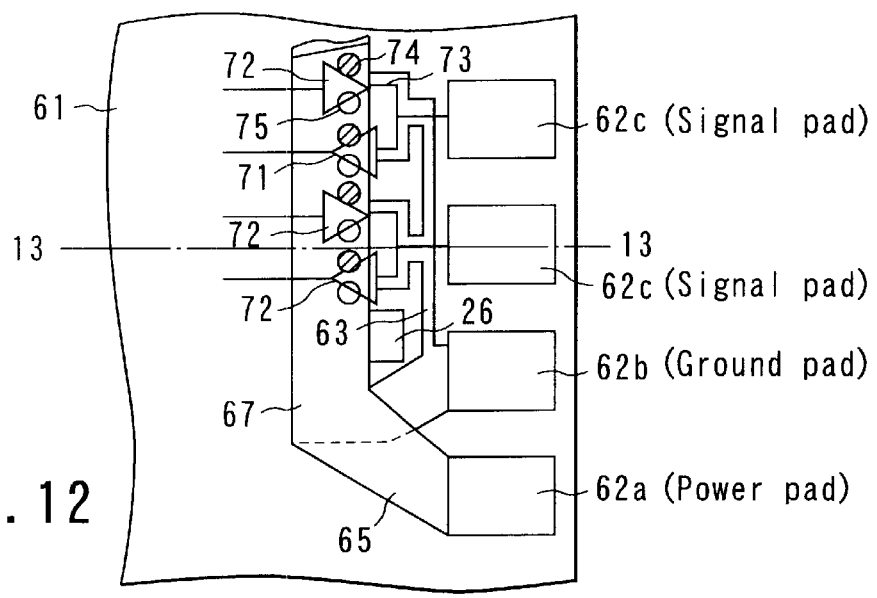
FIG. 12 is a plan view illustrating the arrangement of receivers and drivers in the LSI chip in accordance with a second embodiment of the invention.

FIG. 12 is a plan view illustrating the configuration of the periphery of the receivers and drivers within the LSI chip 61. In FIG. 12, like reference numerals are used to denote corresponding parts to those in FIG. 11. In FIG. 12, the receivers are indicated at 71 and the drivers are indicated at 72. The receivers 71 and the drivers 72 are represented by triangles, not by transistor symbols. Of the triangles, ones whose tips point to the inside of the chip are the receivers, the others are the drivers.

As described previously, the power-ground pair line 67 must be a transmission line even in the vicinity of the transistor gates, i.e., the receivers 71 and the drivers 72; therefore, it should be placed to extend right over the receivers 71 and the drivers 72. An exemplary arrangement therefor is illustrated in FIG. 12. In this case as well, the bypass capacitor 26 may be connected between the power and ground lines as shown.

Figure 13:
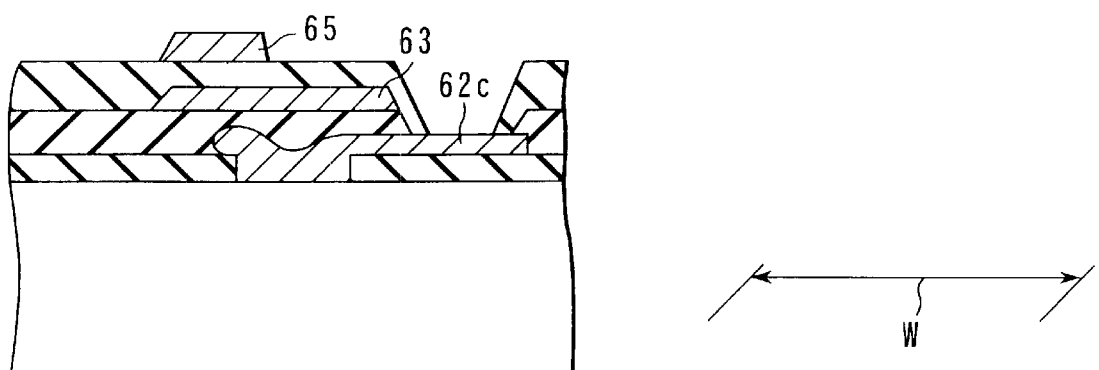
FIG. 13 is a sectional view taken along line 13—13 of FIG. 12.

The ground connection for the transistor gates is achieved by interlayer connection to the overlying ground line 63 as shown in FIG. 13, while the power connection is achieved by connection to the power line 65 overlying the ground line. The connection to the power line 65 may be made either by utilizing through-holes in a printed wiring board or by forming power supply lands on the ground layer. The signal line 73 is paired with the ground line 63. It is important that the ground line 63 should not form into cecal wiring. The ground line that forms a signal-ground pair transmission line consists of that part of the ground line 63 connected to the ground pad 62b and forming the power-ground pair line 67 which branches off from the ground line 63 and extends to the signal pads 62c. The receivers 71 and the drivers 72 are connected with the power line 65 through connection points 74 indicated by circles each marked with an oblique line and connected with the ground line 63 through connection points 75 indicated by circles with no oblique line.

Figure 14:
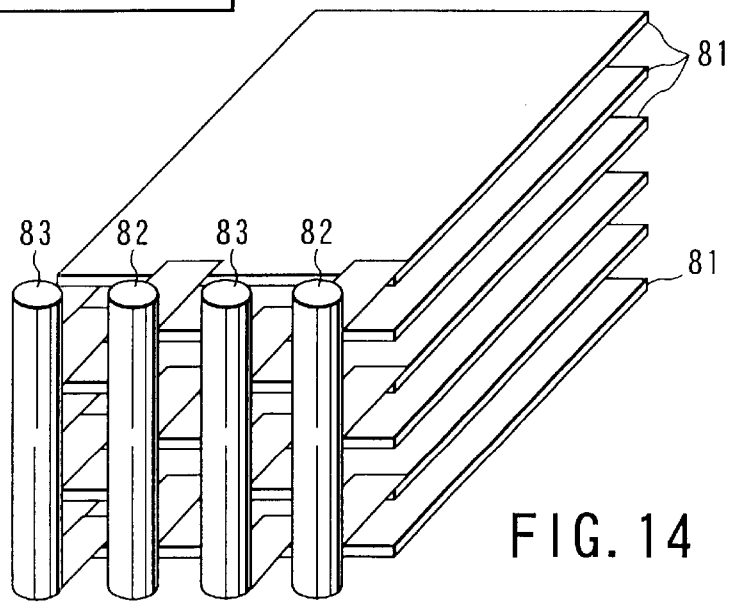
FIG. 14 is a perspective view of a bypass capacitor used in the semiconductor circuit device of FIG. 11.

Referring to FIG. 14, there is illustrated in perspective view the detailed configuration of the bypass capacitor 26. This capacitor is formed by stacking a plurality of rectangular plate-like conductive layers 81 (six layers in this example) with an insulating layer interposed between conductive layers opposed to each other. One of the opposed conductive layers forms a power layer, while the other layer forms a ground layer. Each of the conductive layers 81 has a width of W nearly equal to that of the power line 65 and the ground line 63 in the power-ground pair line 67 in FIG. 11. There are provided interlayer connection through-hole electrodes 82 and 83 along one of the short sides of the conductive layers 81 which is nearer to the LSI chip, the electrodes 82 being connected to the power layers of the conductive layers 81 and the electrodes 83 being connected to the ground layers.

Figure 15:
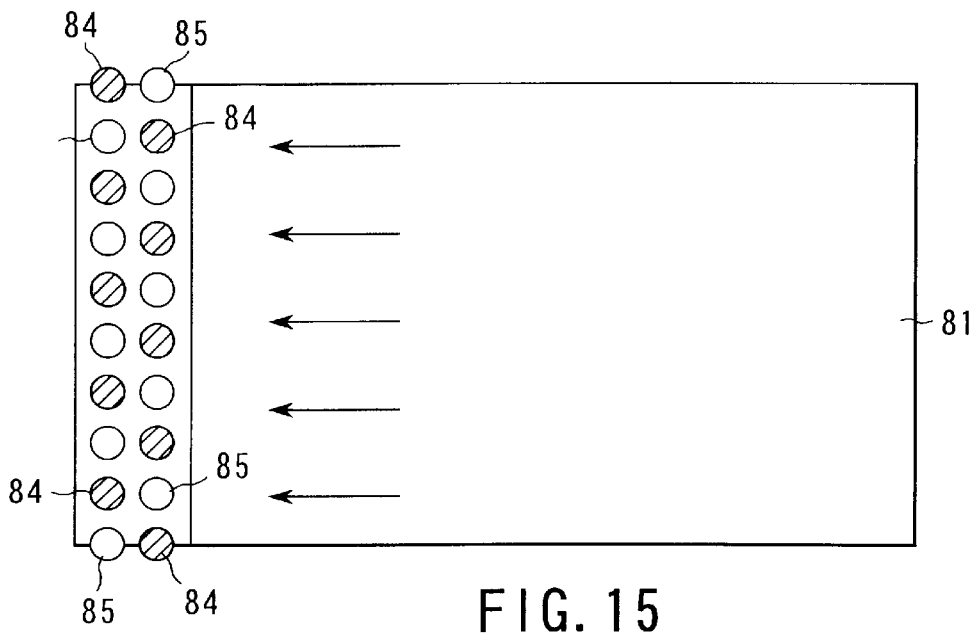
FIG. 15 is a diagram illustrating charge flow in one conductive layer of the capacitor of FIG. 14.
Figure 16:
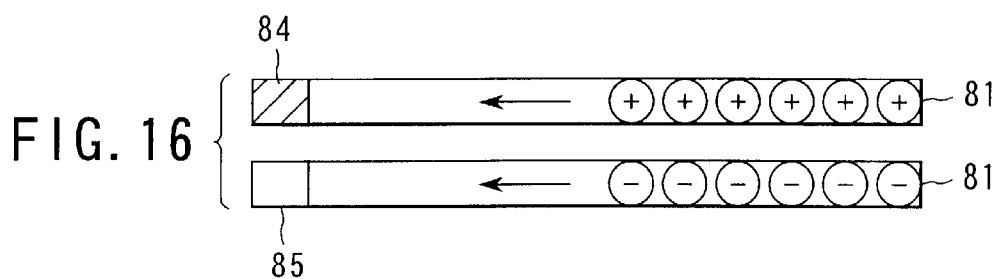
FIG. 16 is a diagram illustrating charge flow in paired power and ground layers in the capacitor of FIG. 14.

FIG. 15 schematically shows the manner in which charges flow in one of the conductive layers 81 in the capacitor of FIG. 14. Likewise, FIG. 16 schematically shows the manner in which charges flow in a pair of conductive layers 81 forming power and ground layers, respectively. In FIGS. 15 and 16, 84 and 85 denote flip-chip electrodes adapted to connect the through-hole electrodes 82 and 83 with the power line 65 and the ground line 63, respectively, in the power-ground pair line 67.

As is evident from FIGS. 15 and 16, the capacitor is intended so as to allow positive and negative charges to flow in the same direction toward the exit (electrodes 84 and 85) and allow as wide a charge flow as possible. To this end, two rows of flip-chip electrodes are used as shown in FIG. 15. However, depending on the structure of the power-ground pair line, linear electrodes can be used.

Figure 17:
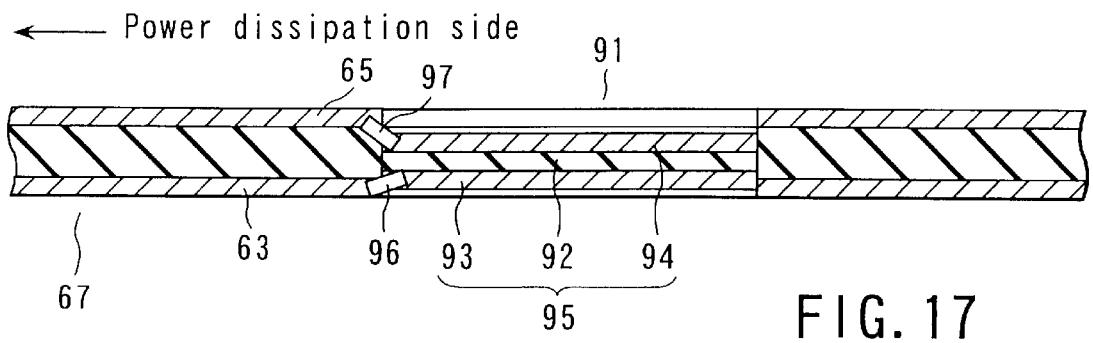
FIG. 17 is a sectional view illustrating another arrangement of the bypass capacitor used in the semiconductor circuit device of FIG. 11.

That is, such a buried capacitor as shown in FIG. 17 can also be used. In FIG. 17, in an intermediate portion 91 of the power-ground pair line 67 consisting of the power line 65 and the ground line 63 is formed a buried capacitor 95 comprised of a pair of conductive layers 93 and 94 with a capacitor insulating film 92 interposed therebetween. The conductive layers 93 and 94 are electrically connected through their overall width to the power line 65 and the ground line 63 by stud electrodes 96 and 97, respectively.

With such a capacitor comprised of a pair of conductive layers as shown in FIG. 17, charges can be taken out from the charge exit through its overall width. The proper selection of the dielectric constant of the capacitor insulating film 92 allows the capacitor to be formed to substantially the same thickness as the insulating film in the power-ground pair line 67. The principle that, as described previously, the bypass capacitor 26 is allowed to have a capacitance as small as several nanofarads allows the bypass capacitor to take such a structure.

Figure 18:
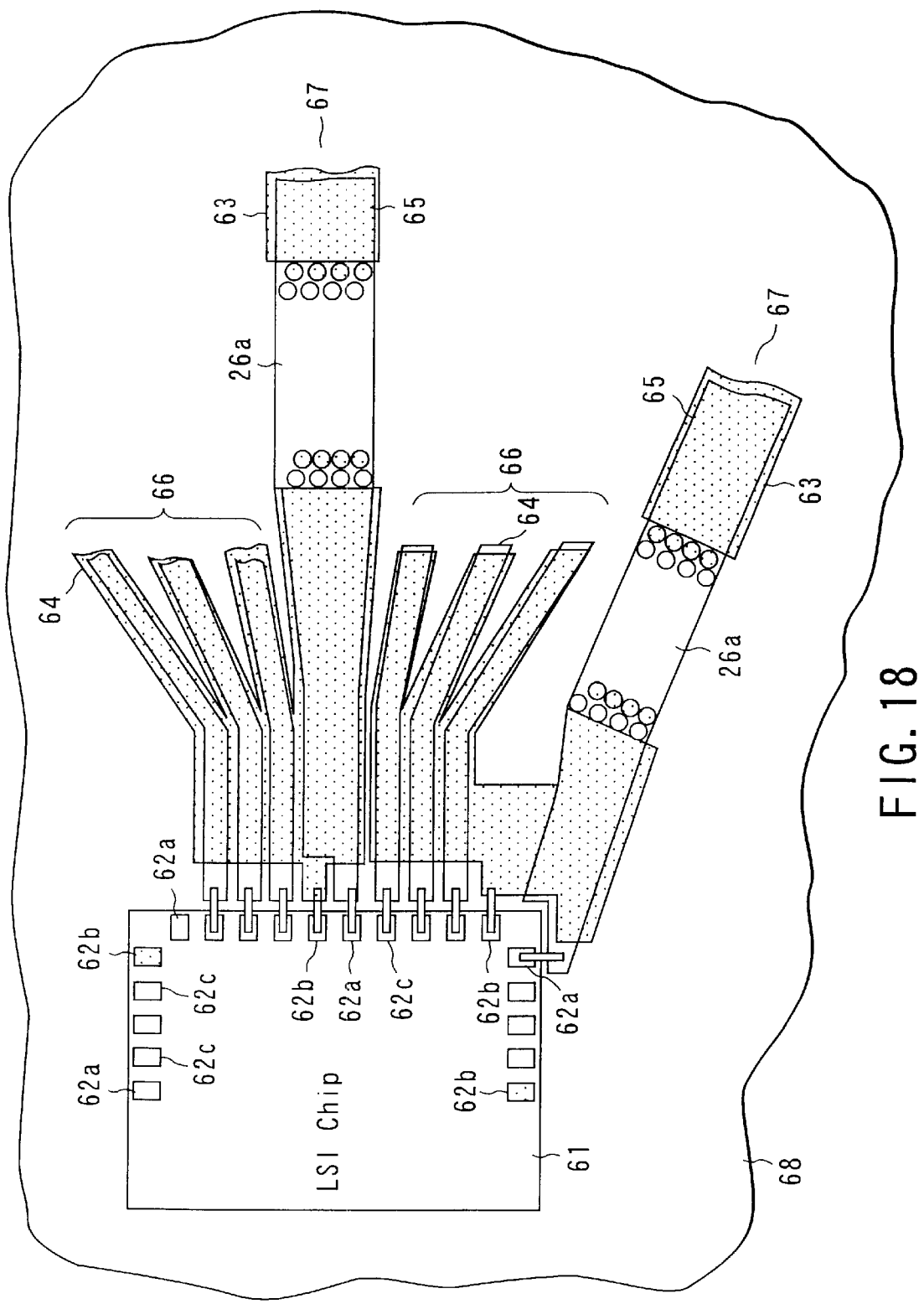
FIG. 18 is a plan view of a semiconductor circuit device including an LSI chip and its associated package in accordance with a third embodiment of the invention.

FIG. 18 is a plan view of a semiconductor circuit device including an LSI chip and its associated package according to a third embodiment of the present invention. In this figure, like reference numerals are used to denote corresponding parts to those in FIG. 11 and descriptions thereof are omitted.

In the semiconductor circuit device of FIG. 11, the power-ground pair line 67 is formed in a plan configuration such that it divides into two in the place where the bypass capacitor 26 is attached and then forms into one again. That is, the pair line 67 is formed unbroken. By contrast, a bypass capacitor 26a acts as a part of the power-ground pair line 67 in the semiconductor circuit device of FIG. 18. In other words, the capacitor 26a connects one power-ground pair line 67 to another power-ground pair line 67. More specifically, the capacitor 26a is connected at one end to the power line 65 and ground line 63 of the first power-ground pair line 67, and at the other end to the power line 65 and ground line 81 of the second power-ground pair line 67. That is, in the place where the bypass capacitor 26a is provided the power-ground pair line 67 does not exist and the bypass capacitor itself is used as a transmission line.

Figure 19:
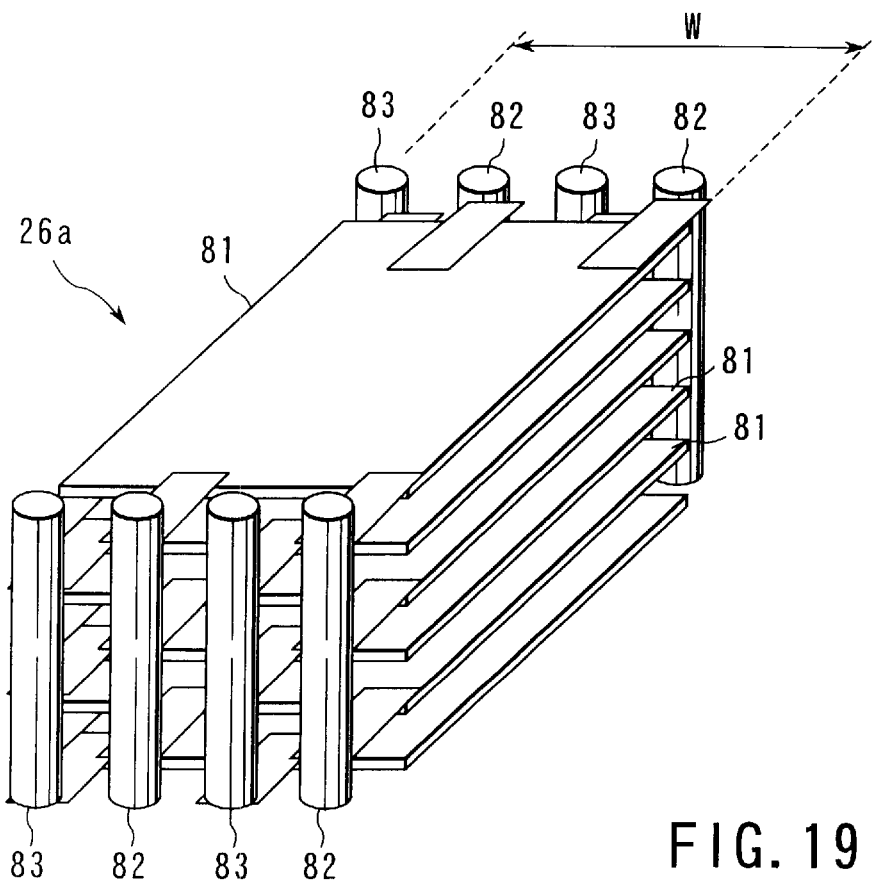
FIG. 19 is a perspective view of a bypass capacitor used in the semiconductor circuit device of FIG. 18.
Figure 20:
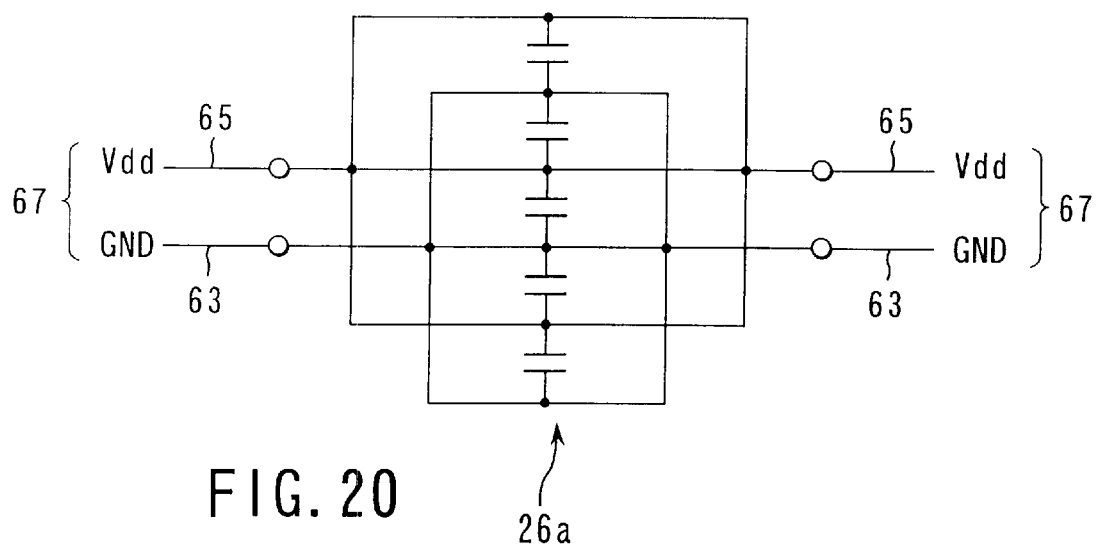
FIG. 20 is a circuit diagram illustrating the connection between the bypass capacitor of FIG. 19 and the paired power and ground layers.

FIG. 19 is a perspective view of the bypass capacitor 26a in FIG. 18. This capacitor is formed by stacking a plurality of rectangular plate-like conductive layers 81 (six layers in this example) with an insulating layer interposed between conductive layers opposed to each other. One of the opposed conductive layers forms a power layer, while the other layer forms a ground layer. Each of the conductive layers 81 has a width of W nearly equal to that of the power line 65 and the ground line 63 in the power-ground pair line 67 in FIG. 18. There are provided interlayer connection through-hole electrodes 82 and 83 along the short sides of the conductive layers 81 to connect the conductive layers 81 to the power-ground pair line 67. Thus, as can be seen from an equivalent circuit of FIG. 20, the bypass capacitor 26a forms part of the power-ground pair line 67.

Figure 21:
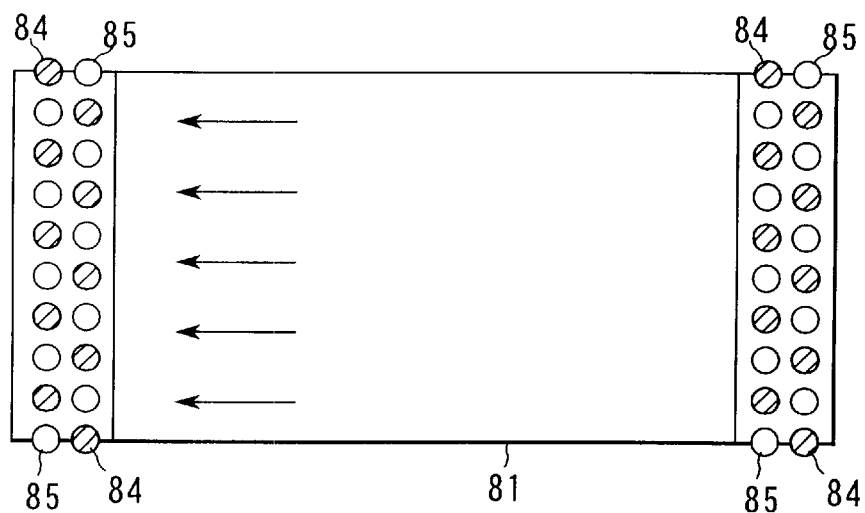
FIG. 21 is a diagram illustrating the charge flow in one conductive layer of the capacitor of FIG. 19.
Figure 22:
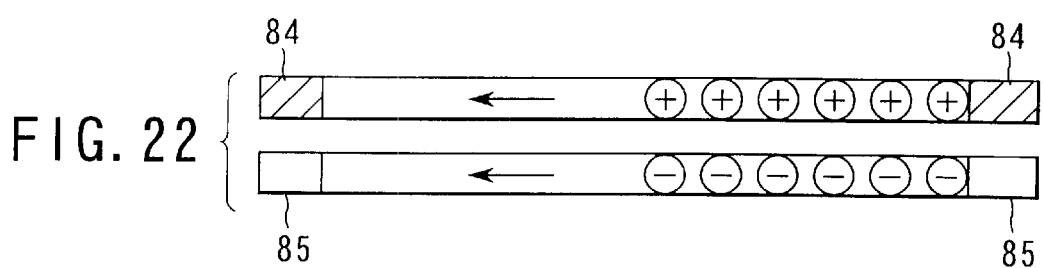
FIG. 22 is a diagram illustrating the charge flow in paired power and ground layers in the capacitor of FIG. 19.

FIG. 21 schematically shows the manner in which charges flow in one of the conductive layers 81 in the capacitor of FIG. 19. Likewise, FIG. 22 schematically shows the manner in which charges flow in a pair of conductive layers 81 forming power and ground layers, respectively. In FIGS. 21 and 22, 84 and 85 denote flip-chip electrodes adapted to connect the through-hole electrodes 82 and 83 with the power line 65 and the ground line 63, respectively, in the power-ground pair line 67.

As is evident from FIGS. 21 and 22, the capacitor is intended so as to allow positive and negative charges to flow in the same direction toward the exit (electrodes 84 and 85) and with wide distribution over the width of the conductive layers.

In the semiconductor circuit device of FIG. 18, since the bypass capacitor 26a is used as part of the power-ground pair line 67, the characteristic impedance of the transmission line becomes discontinuous, causing energy to be reflected between the power-ground pair line 67 and the bypass capacitor 26a. However, analyses revealed that most energy comes to pass through the bypass capacitor 26a with time. This will be described hereinafter.

Figure 23:
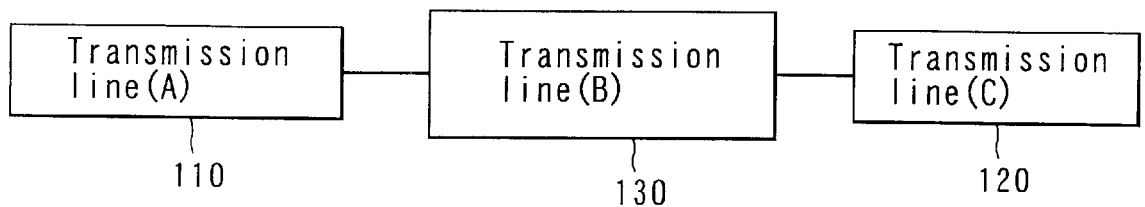
FIG. 23 shows an equivalent circuit of the circuit of FIG. 20.

Suppose now that, as shown in FIG. 23, between two transmission lines 110 and 120 having substantially the same characteristic impedance is inserted a transmission line 130 having a different characteristic impedance. We verified that energy is transmitted from the transmission line 110 to the transmission line 120 while undergoing repeated reflections within the transmission line 130. For the sake of convenience, we refer to transmission lines 110, 130 and 120 as A, B and C, respectively.

Here, let the characteristic impedance of the transmission lines A and B be, say, 50 ohms and that of the transmission line B be Z ohms. Assume that all energy is transmitted from the transmission line A to the transmission line C. Then, incompatibility with this assumption will occur unless the total energy reflected back to the transmission line A at the entrance of the transmission line B becomes zero. We therefore verified that the sum of currents that return from the transmission line B to the transmission line A becomes zero.

The coefficient, Γ, of reflection from the transmission line having a characteristic impedance of 50 ohms to the transmission line having a characteristic impedance of Z ohms is given by $$\Gamma=(Z-50)/(Z+50) \qquad (1)$$

Also, the coefficient, Γ', of reflection from the transmission line having a characteristic impedance of Z ohms to the transmission line having a characteristic impedance of 50 ohms is given by $$\Gamma'=(50-Z)/(50+Z)=-\Gamma \qquad (2)$$

Thus, when initial voltage V is applied to the transmission line A, the voltage transmitted to the transmission line B becomes V(1+Γ) (neglecting the loss within the transmission line B).

Voltage VCB1 that passes through the transmission line B and is reflected back into it at the entrance of the transmission line C is given by $$VCB1=-\Gamma V(1+\Gamma) \qquad (3)$$

Voltage VAB1 that returns to the exit of the transmission line A and then passes through it is given by $$VAB1=-\Gamma V(1+\Gamma)\,(1+(-\Gamma))=-\Gamma V(1-\Gamma^2) \qquad (4)$$

Voltage VBA1 that returns to the exit of the transmission line A and is then reflected back into the transmission line B is given by $$VBA1=-\Gamma V(1+\Gamma)\,(-\Gamma)=\Gamma^2 V(1+\Gamma) \qquad (5)$$

Figure 24:
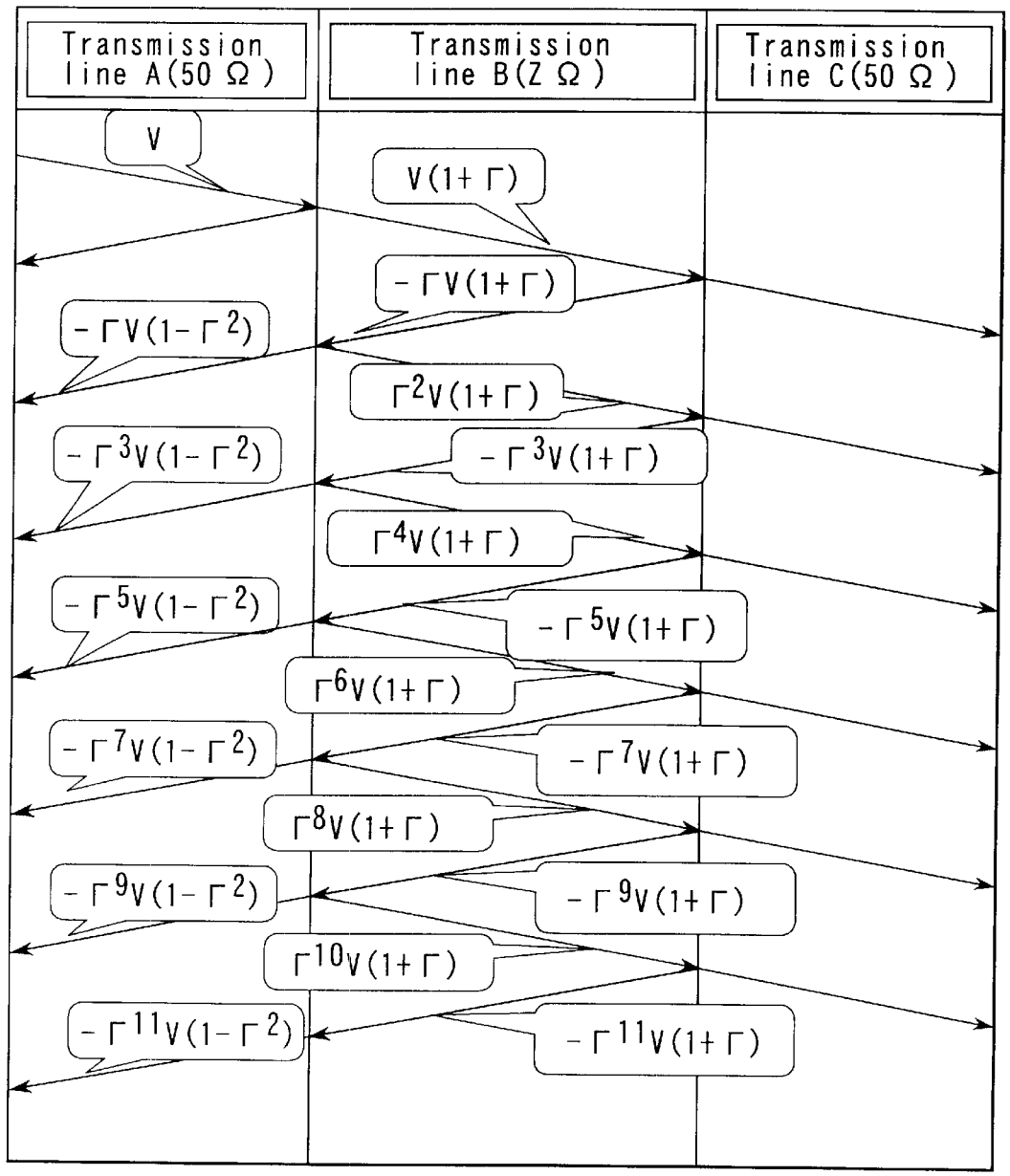
FIG. 24 is a diagram illustrating the manner in which the supply voltage is transmitted through the circuit of FIG. 23.

After that, such reflections are repeated over and over again as illustrated in FIG. 24.

For example, the total S of voltages that are reflected from the transmission line B back to the transmission line A is given by $$S=-\Gamma V(1+\Gamma^2)-\Gamma^3 V(1+\Gamma^2)-\Gamma^5 V(1+\Gamma^2)-\Gamma^7 V(1+\Gamma^2)\ldots$$
$$=-\Gamma V(1+\Gamma^2)(1+\Gamma^2+\Gamma^4+\Gamma^6+\Gamma^8+\Gamma^{10}+\ldots)$$
$$=-\Gamma V(1+\Gamma^2)/(1-\Gamma^2)$$
$$=-\Gamma V \qquad (6)$$

The addition to expression (6) of the voltage ΓV that was first reflected from the transmission line B back into the transmission line A shows that −ΓV+ΓV=0.

An important conclusion is that, even if an impedance mismatch occurs with an intervening transmission line, all the energy comes to pass through while repeating reflections. However, transitional phenomena associated with repeated reflections may cause voltage waveforms to be distorted. Intuitively, this is expected to be allowable on condition that the period of multiple reflections is short and the mismatched transmission line is short. Let us consider that, in FIG. 23, the length of the transmission line B is two times (2L) that of the transmission lines A and C and the characteristic impedance Z is 100 ohms.

First, the first-order passed component and the first- and second-order reflected components are examined. Namely, an examination is made on $(1-\Gamma^2)$VO$(1+\Gamma^2 \cos 2\pi f\alpha)\sin 2\pi ft+\Gamma^2 \sin 2\pi f\alpha \cos 2\pi ft$ where $\alpha$ is a value obtained by dividing the length, 2L, of the transmission line B by the propagation velocity. Since the propagation velocity is about 150 mm/lnsec in glass epoxy substrates, $2\pi f\alpha$ is 4 $\pi fL/150$ (nsec). Further, $\Gamma$ is $\Gamma=(100-50)/(100+50)=\frac{1}{3}$ and $\Gamma^2$ is $\frac{1}{9}$.

Assuming that f=1 GHz, the part in the expression for the first passed component and the next reflected components that follows $(1-\Gamma^2)$ VO becomes $(1+(\frac{1}{9})\cos 4\pi L/150)\sin 2\pi t \cdot 10^9 + (\frac{1}{9})\sin (4 \pi L/150)\cos \pi t \cdot 10^9$.

We determined through simulation how transmission waveforms vary according to the length, L, of the transmission line. The simulation verified that, when the length of the mismatched transmission line is 10 mm or so, the mismatching of 100 ohms to 50 ohms does not have so great an effect on a sinusoidal wave of 1 GHz. With 3-GHz pulses corresponding to a 10-GHz sinusoidal wave, it was verified that the mismatching has no effect provided that the mismatched transmission line is 1 mm or less in length.

In conclusion, when the bypass capacitor is regarded as a transmission line, the line length that is free from the effect of the characteristic impedance mismatching depends on the frequency. That is, although no long bypass capacitor can be used, any capacitor, if its length has been set according to the frequency of a transmission signal, will provide a good transmission characteristic. For a sinusoidal wave, the relation of the length L to the frequency f can be simplified as follows:

$$L=(1/f)\ 10^{10}\ (mm)$$

For a pulse signal, the length L is related to the frequency f by $$L=(1/3\ f)\ 10^{10}\ (mm)$$

With the pulse signal, the third harmonic frequency is used as the typical frequency. Any capacitor, if its length has been set to be equal to or less than the length thus set, can be connected in series with the power-ground pair line.

Figure 25:
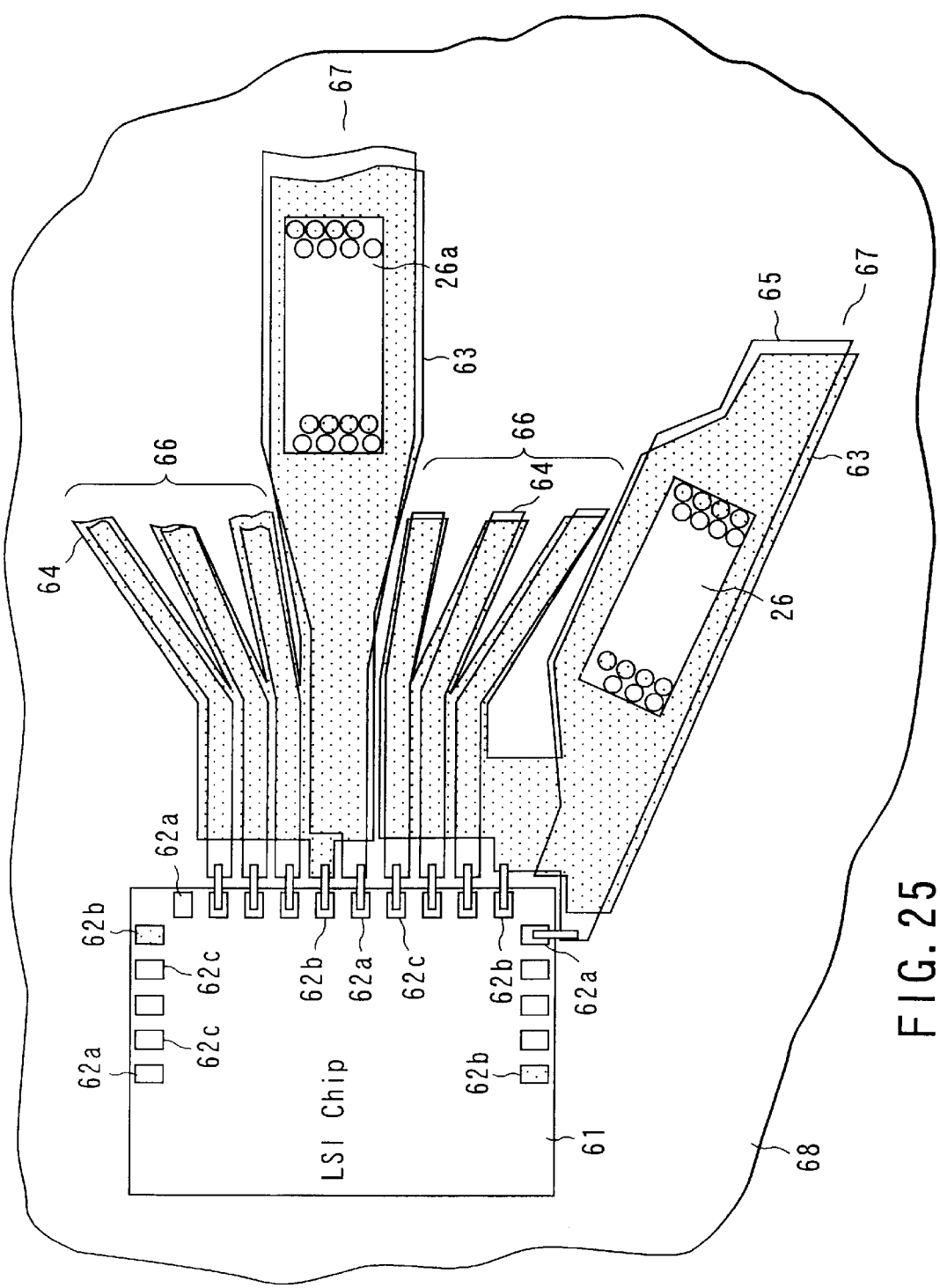
FIG. 25 is a plan view of a semiconductor circuit device including an LSI chip and its associated package in accordance with a fourth embodiment of the invention.

FIG. 25 is a plan view of a semiconductor circuit device including an LSI chip and its associated package according to a fourth embodiment of the present invention. In this figure, like reference numerals are used to denote corresponding parts to those in FIG. 11 and descriptions thereof are omitted.

In this embodiment, the bypass capacitors 26 in the semiconductor circuit device of FIG. 11 are replaced by bypass capacitors 26a formed in the same manner as the bypass capacitors in FIG. 18. That is, in the present embodiment, the power-ground pair line 67 is formed in a plan configuration such that it divides into two in the place where the bypass capacitor 26 is attached and then forms into one again. The width of each of the branched portions is set to substantially ½ of the width of the non-branched portion.

According to this semiconductor circuit device, since the bypass capacitor 26a itself forms part of the power-ground pair line 67, the characteristic impedance in the portion where the bypass capacitor 26a is provided can be set lower than in FIG. 18.

According to the present invention, as described thus far, semiconductor circuit devices can be provided which allow the power-ground pair lines to have a sufficient charge supply capacity without being limited by the characteristics of transistor gate circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor circuit device comprising:
   a transmission pair line composed of a power line and a ground line which have substantially the same thickness and are formed one above the other, the power line and the ground line being electrically separated from each other; and
   an electronic circuit coupled with the transmission pair line to receive a supply voltage through the transmission pair line.

2. The semiconductor circuit device according to claim 1, wherein the transmission pair line has a characteristic impedance that is substantially equal to or lower than the impedance of the entire electronic circuit.

3. The semiconductor circuit device according to claim 1, wherein the power line and the ground line are each formed of a conductive layer and their thickness is substantially equal to the width of the conductive layer.

4. The semiconductor circuit device according to claim 1, wherein the transmission pair line composed of the power line and the ground line is formed in a semiconductor integrated circuit chip.

5. The semiconductor circuit device according to claim 1, wherein the transmission pair line composed of the power line and the ground line is formed on a wiring board.

6. The semiconductor circuit device according to claim 1, wherein the transmission pair line composed of the power line and the ground line has the structure of a power-ground pair transmission line up to its end.

7. A semiconductor circuit device comprising:
   a transmission line composed of a power line and a ground line which have substantially the same thickness and are formed one above the other, the power line and the ground line being electrically separated from each other;
   an electronic circuit coupled with the transmission line to receive a supply voltage through the transmission line; and
   a bypass capacitor coupled with a power supply section of the electronic circuit or the vicinity thereof for holding an amount of charge several times to several tens of times larger than an amount of charge to be supplied to the electronic circuit.

8. The semiconductor circuit device according to claim 7, wherein the bypass capacitor is provided in the midst of the transmission line.

9. The semiconductor circuit device according to claim 8, wherein the bypass capacitor forms part of the transmission line.

10. The semiconductor circuit device according to claim 7, wherein the total of leakage inductances associated with the bypass capacitor and an interconnection to which the bypass capacitor is coupled is not greater than 1/A (GHz)× 100 ps=XpH where A is the frequency of a clock applied to the electronic circuit and X is an inductance value obtained by calculation.

11. The semiconductor circuit device according to claim 7, wherein the bypass capacitor comprises at least two plate-like conductive layers which have a width approximating the width of the conductive layers forming the power line and the ground line and are formed one above the other with an insulating layer interposed therebetween, and a plurality of electrodes which are provided along one of that pair of sides of the at least two conductive layers which are opposed to each other in the direction of length of the conductive layers, which is nearer to the electronic circuit, one set of the electrodes being coupled to the power line and the other set being coupled to the ground line.

12. The semiconductor circuit device according to claim 8, wherein the bypass capacitor comprises at least two plate-like conductive layers which have a width approximating the width of the conductive layers forming the power line and the ground line and are formed one above the other with an insulating layer interposed therebetween, and a plurality of electrodes which are provided along that pair of sides of the at least two conductive layers which are opposed to each other in the direction of length of the conductive layers, the electrodes including ones coupled to the power line and ones coupled to the ground line.

13. The semiconductor circuit device according to claim 1, wherein the electronic circuit includes a transistor gate circuit having a transistor that is powered from the transmission line and connected to a signal line, and a resistor element connected in series between the power supply side of the transistor gate circuit and the transmission line, the resistance Rps of the resistor element being set to satisfy Ron+Rps=Z0 where Ron is the on resistance of the transistor and Z0 is the characteristic impedance of the signal line.

14. A semiconductor circuit device comprising:
a transmission pair line composed of a power line and a ground line which have substantially the same thickness and are formed one above the other, the power line and the ground line being electrically separated from each other;
a plurality of transistors each having a current path having its one end coupled to the power line of the transmission pair line; and
a plurality of signal lines corresponding in number of the transistors, each of the signal lines being coupled to the other end of the current path of the corresponding transistor.

15. The semiconductor circuit device according to claim 14, wherein the characteristic impedance Z0 ps of the transmission pair line is set such that Z0 ps≦Z0/N where Z0 is the characteristic impedance of the signal lines and N is the number of signal lines.

16. The semiconductor circuit device according to claim 14, wherein the power line and the ground line are each formed of a conductive layer and their thickness is substantially equal to the width of the conductive layer.

17. The semiconductor circuit device according to claim 14, wherein the transmission pair line composed of the power line and the ground line is formed in a semiconductor integrated circuit chip.

18. The semiconductor circuit device according to claim 14, wherein the transmission pair line composed of the power line and the ground line is formed on a wiring board.

19. The semiconductor circuit device according to claim 14, wherein the transmission pair line composed of the power line and the ground line has the structure of a power-ground pair transmission line up to its end.

20. A semiconductor circuit device comprising:
a transmission line composed of a power line and a ground line which have substantially the same thickness and are formed one above the other, the power line and the ground line being electrically separated from each other;
a plurality of transistors each having a current path having its one end coupled to the power line of the transmission line;
a plurality of signal lines corresponding in number of the transistors, each of the signal lines being coupled to the other end of the current path of the corresponding transistor; and
a bypass capacitor coupled with a power supply section of the electronic circuit or the vicinity thereof for holding an amount of charge several times to several tens of times larger than an amount of charge to be supplied to the electronic circuit.

21. The semiconductor circuit device according to claim 20, wherein the bypass capacitor is provided in the midst of the transmission line.

22. The semiconductor circuit device according to claim 21, wherein the bypass capacitor forms part of the transmission line.

23. The semiconductor circuit device according to claim 20, wherein the bypass capacitor comprises at least two plate-like conductive layers which have a width approximating the width of the conductive layers forming the power line and the ground line and are formed one above the other with an insulating layer interposed therebetween, and a plurality of electrodes which are provided along one of that pair of sides of the at least two conductive layers which are opposed to each other in the direction of length of the conductive layers, which is nearer to the electronic circuit, one set of the electrodes being coupled to the power line and the other set being coupled to the ground line.

* * * * *